United States Patent
Park et al.

(10) Patent No.: US 7,894,027 B2
(45) Date of Patent: Feb. 22, 2011

(54) THIN FILM TRANSISTOR DISPLAY SUBSTRATE AND METHOD OF THE FABRICATING THE SAME

(75) Inventors: Dae-Jin Park, Incheon (KR); Jang-Kyum Kim, Seoul (KR); Ju-Han Bae, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 267 days.

(21) Appl. No.: 12/273,446

(22) Filed: Nov. 18, 2008

(65) Prior Publication Data

US 2009/0152555 A1 Jun. 18, 2009

(30) Foreign Application Priority Data

Dec. 18, 2007 (KR) ...................... 10-2007-0133498

(51) Int. Cl.
G02F 1/1335 (2006.01)
(52) U.S. Cl. .................................................... 349/113
(58) Field of Classification Search .................. 349/113
See application file for complete search history.

(56) References Cited

U.S. PATENT DOCUMENTS

| 7,609,344 B2 * | 10/2009 | Chang et al. ................. 349/114 |
| 2002/0113927 A1 * | 8/2002 | Ha et al. ..................... 349/113 |
| 2007/0013839 A1 * | 1/2007 | Rho .......................... 349/114 |

* cited by examiner

Primary Examiner—Sung H Pak
(74) Attorney, Agent, or Firm—Innovation Counsel LLP

(57) ABSTRACT

A thin film transistor display substrate comprises a base substrate on which a pixel area including a first reflection area and a second reflection area is defined. A gate line formed on the base substrate and a data line formed on the base substrate. The data line is insulated from and intersected with the gate line to define the pixel area. A thin film transistor is formed in the pixel area and connected to the gate line and the data line. A first reflection layer is formed on the base substrate and corresponds to the first reflection area. A color filter is formed on the first reflection layer and corresponds to the pixel area. A second reflection layer is formed on the color filter and corresponds to the second reflection area. A pixel electrode is formed on the color filter and is electrically connected to the thin film transistor.

21 Claims, 15 Drawing Sheets

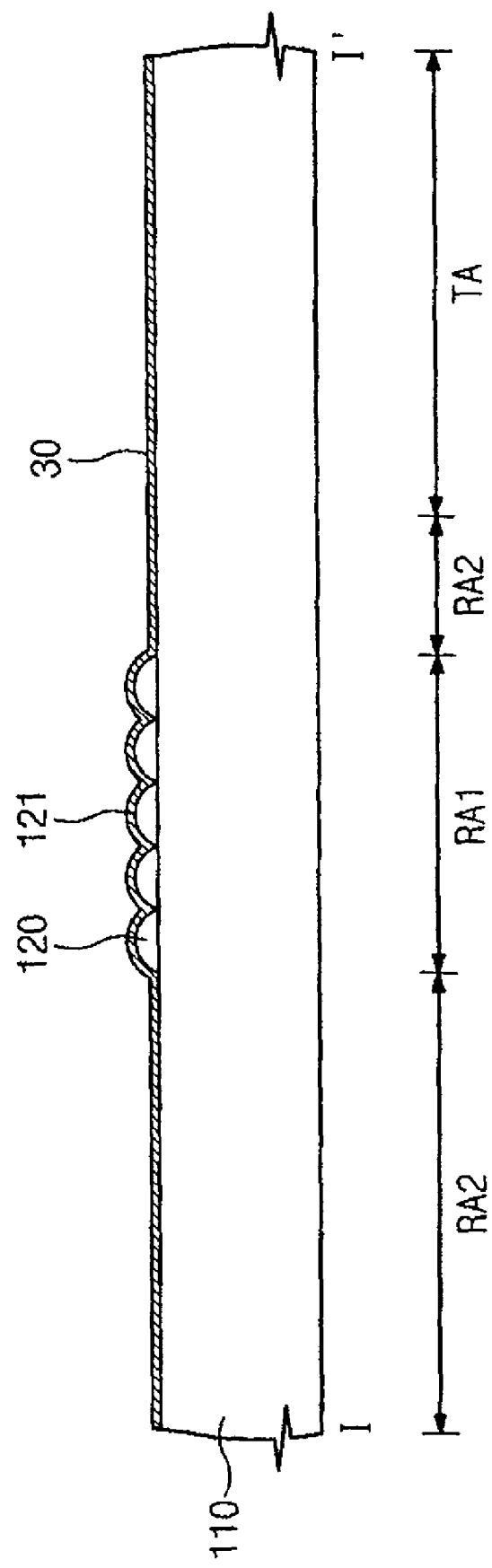

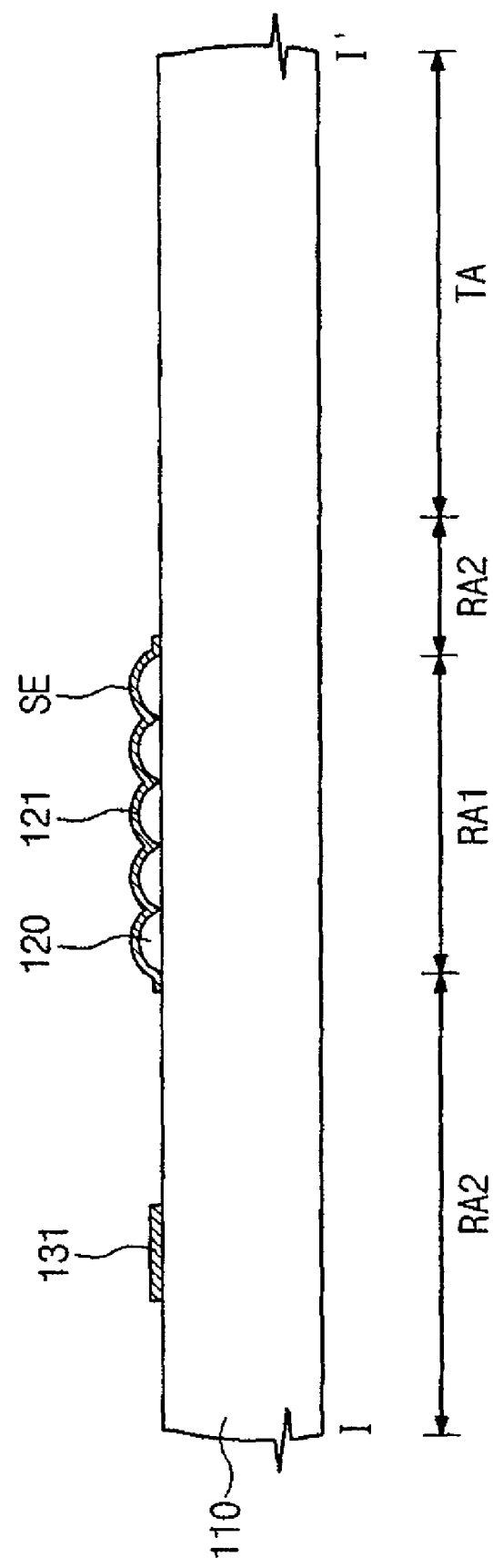

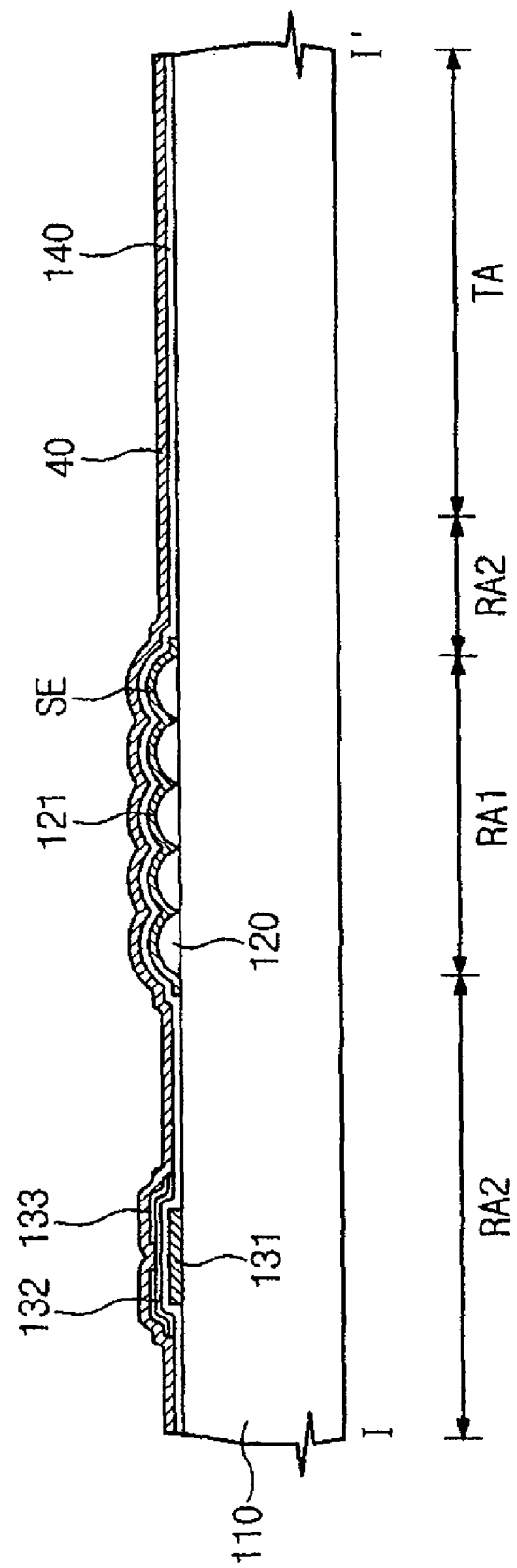

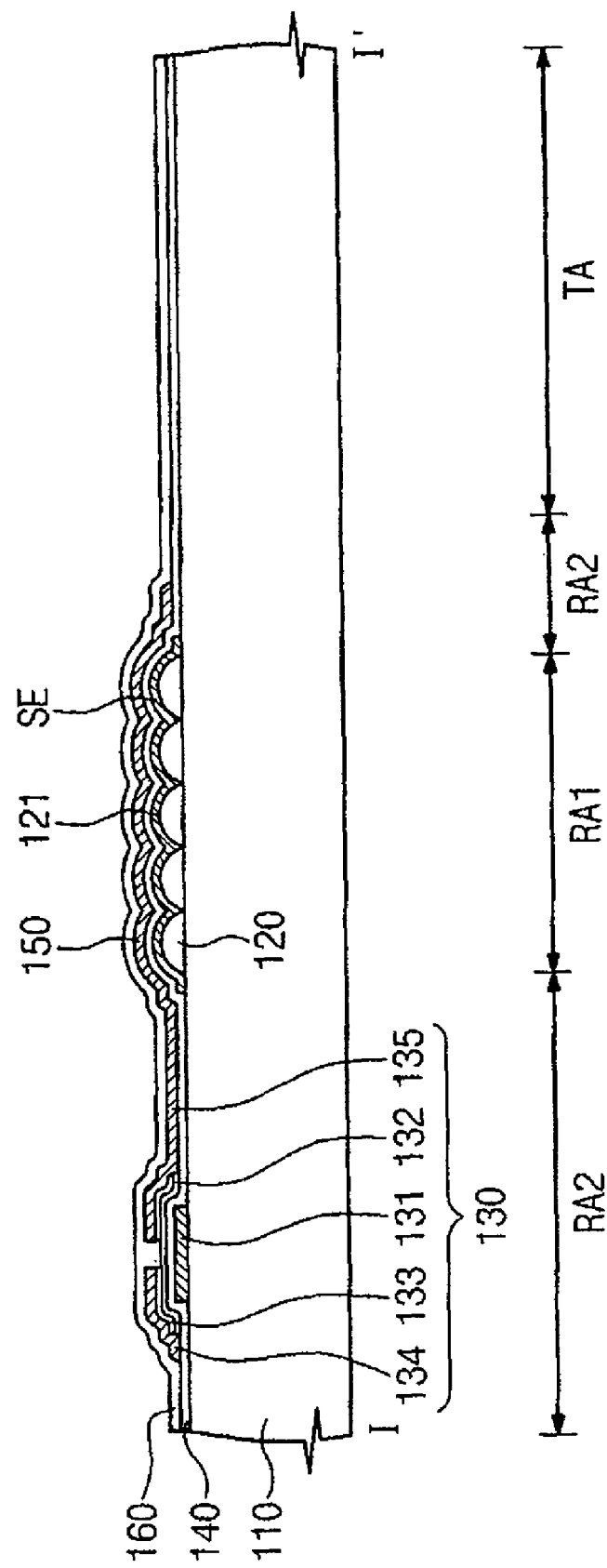

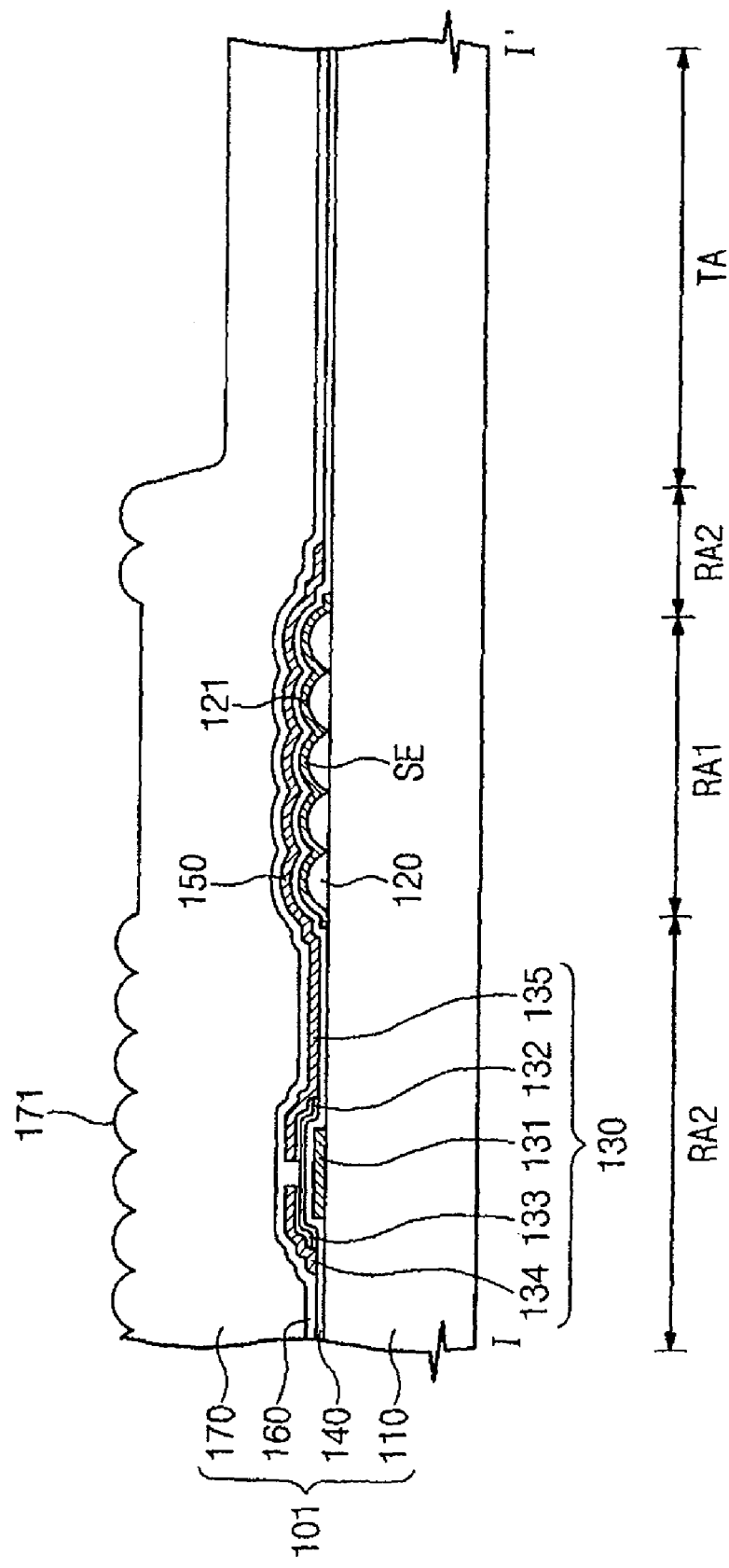

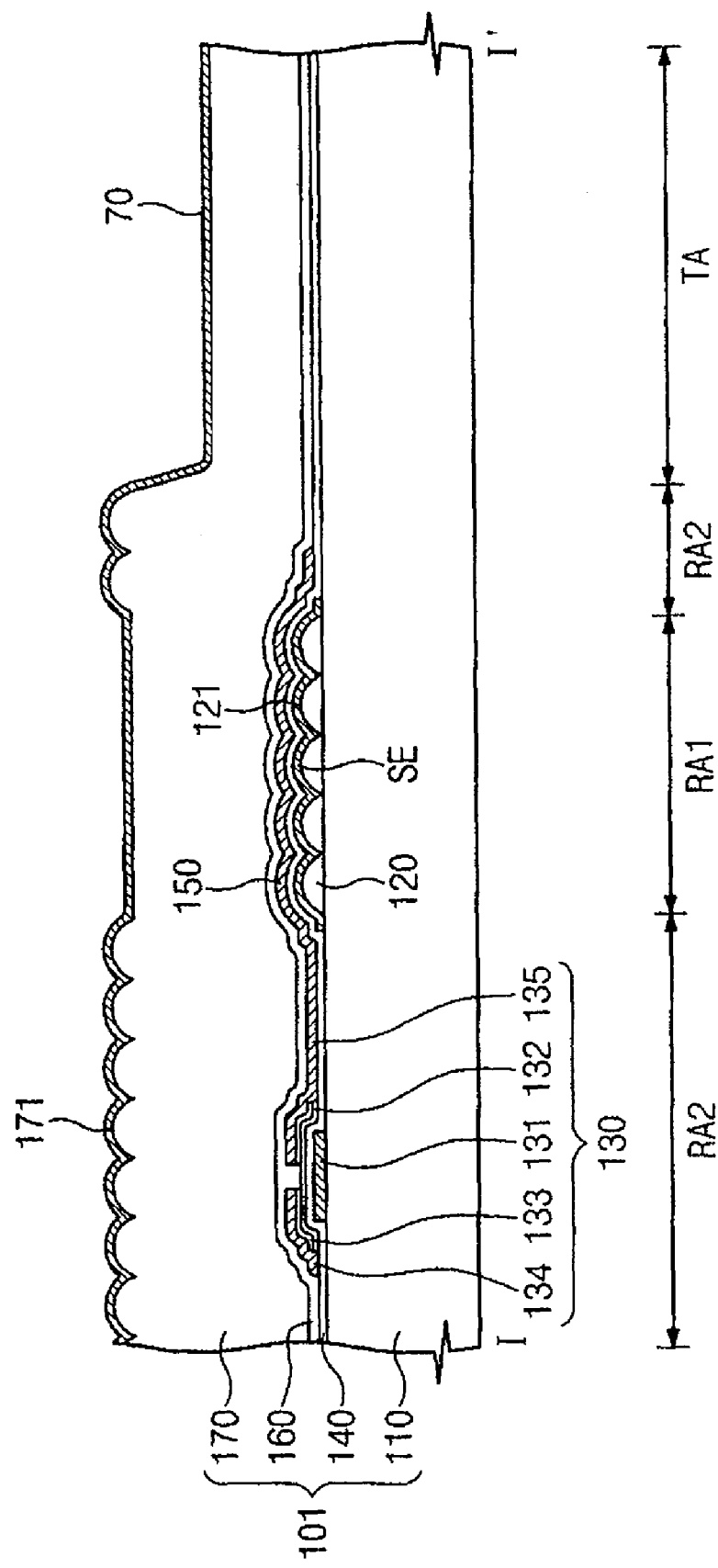

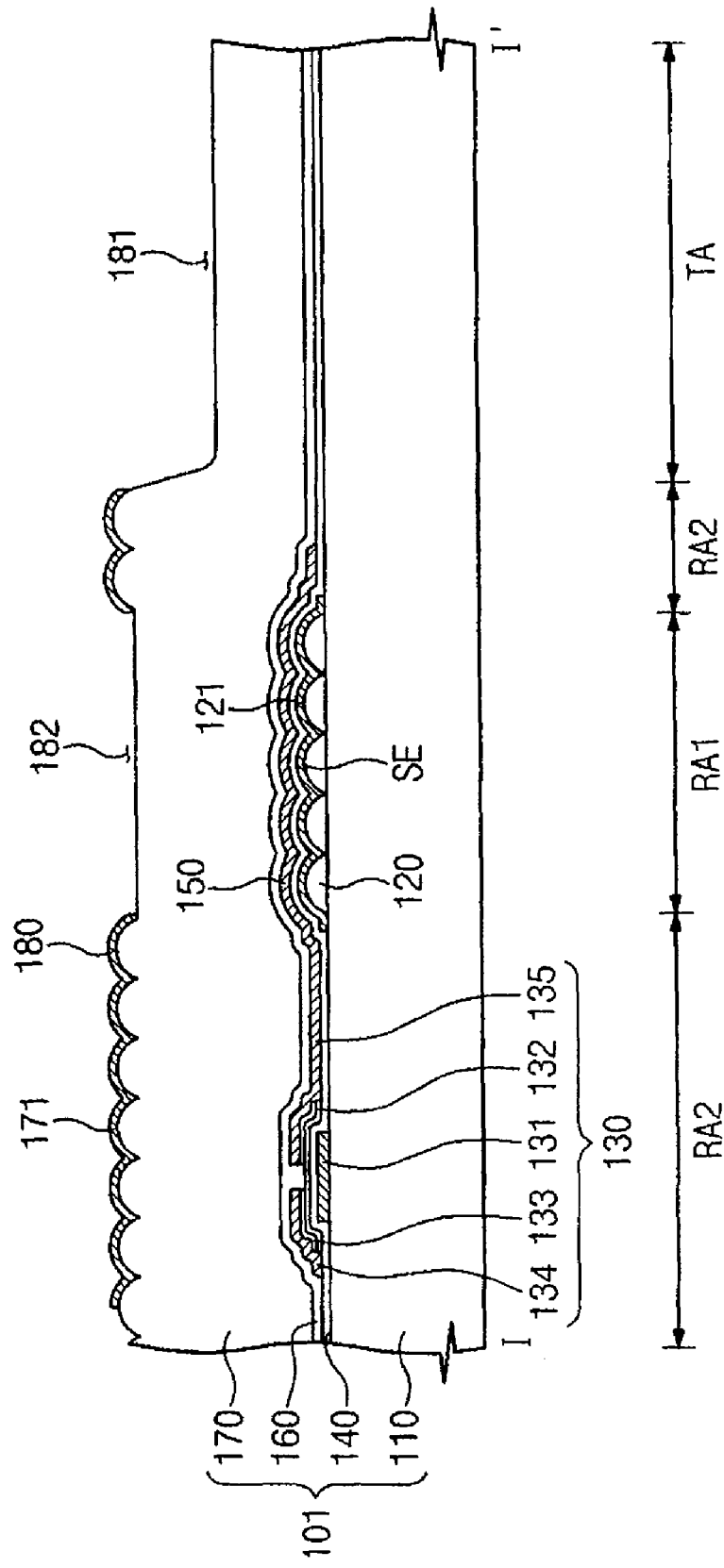

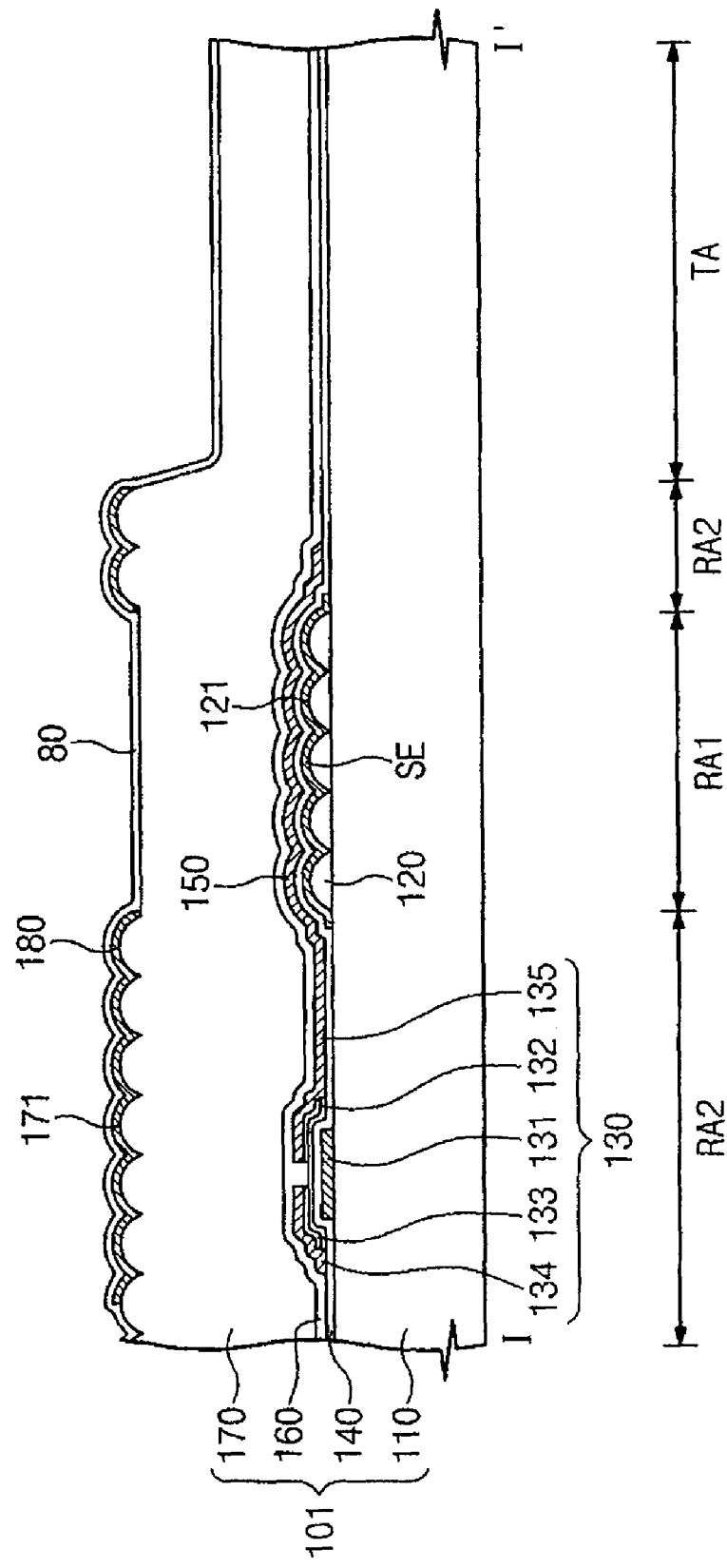

THIN FILM TRANSISTOR DISPLAY SUBSTRATE AND METHOD OF THE FABRICATING THE SAME

CROSS-REFERENCE TO RELATED APPLICATION

This application relies for priority upon Korean Patent Application No. 2007-133498 filed on Dec. 18, 2007, the contents of which are herein incorporated by reference in its entirety.

BACKGROUND OF THE INVENTION

1. Field of the Invention

The present invention relates to a thin film transistor display substrate for a display apparatus. More particularly, the present invention relates to a thin film transistor display substrate having a color filter-on-array structure and a method of fabricating the thin film transistor display substrate.

2. Description of the Related Art

In general, a color filter-on-array (COA) liquid crystal display panel includes an array substrate, an opposite substrate facing the array substrate, and a liquid crystal layer interposed between the array substrate and the opposite substrate.

The array substrate includes a plurality of pixels each displaying an image. Each pixel includes a thin film transistor, a pixel electrode, and a color filter. The pixel electrode is electrically connected to a drain electrode of the thin film transistor and receives a pixel voltage. The color filter is arranged under the pixel electrode and displays a predetermined color using a light.

In such a COA liquid crystal display, it may be difficult to employ a transflective mode since the color filter is formed on the array substrate. In a transflective mode liquid crystal display panel, a reflection layer that reflects an external light is formed on an uppermost portion of the array substrate, and a transmission opening, that transmits a light generated from a backlight assembly, is formed in a transmission area. Therefore, the transflective mode liquid crystal display panel displays an image using an external light and the light from the backlight assembly. If a transflective mode is applied to the COA liquid crystal display panel, colors are not displayed in the reflection mode since the reflection layer is formed above the color filter.

SUMMARY OF THE INVENTION

In an exemplary embodiment, a thin film transistor display substrate is capable of improving a display characteristic.

In an exemplary embodiment, a fabrication method is capable of fabricating the thin film transistor display substrate.

In an exemplary embodiment, a thin film transistor display substrate includes a base substrate, a gate line, a data line, a thin film transistor, a first reflection layer, a color filter, a second reflection layer, and a pixel electrode.

A pixel area, including a first reflection area and a second reflection area, is defined on the base substrate, and a gate line is formed on the base substrate. The data line is formed on the base substrate, and the data line is insulated from and intersected with the gate line to define the pixel area. The thin film transistor is formed in the pixel area and is connected to the gate line and the data line. The first reflection layer is formed on the base substrate corresponding to the first reflection area. The color filter is formed on the first reflection layer corresponding to the pixel area. The second reflection layer is formed on the color filter corresponding to the second reflection area. The pixel electrode is formed on the color filter and is electrically connected to the thin film transistor.

The thin film transistor display substrate may further include a patterned layer. The patterned layer may be formed under the first reflection layer and include a first reflection pattern formed thereon. A second reflection pattern may be formed on the color filter corresponding to the first and second reflection areas.

In an exemplary embodiment, a method of fabricating a thin film transistor display substrate is provided as follows.

A thin film transistor is formed in a pixel area of a base substrate, and a first reflection layer is formed in a first reflection area of the pixel area. A color filter, corresponding to the pixel area, is formed on the base substrate on which the thin film transistor and the first reflection layer are formed. A second reflection layer is formed on the color filter corresponding to a second reflection area of the pixel area. A pixel electrode that is electrically connected to the thin film transistor is formed on the color filter.

Prior to forming the first reflection layer, a patterned layer, including a first reflection pattern formed thereon, may be formed in the first reflection area.

The thin film transistor display substrate may include the first reflection layer arranged under the color filter and the second reflection layer arranged on the color filter. The thin film transistor display substrate may have a color filter-on-array structure and may be driven in a transflective mode at the same time, thereby reducing light loss and improving a display characteristic.

BRIEF DESCRIPTION OF THE DRAWINGS

The above and other advantages of the present invention will become readily apparent by reference to the following detailed description when considered in conjunction with the accompanying drawings wherein:

FIGS. 3A to 3K are cross-sectional views illustrating an exemplary embodiment of a fabricating process of an array substrate of FIG. 2;

DESCRIPTION OF THE EMBODIMENTS

Figure 1:
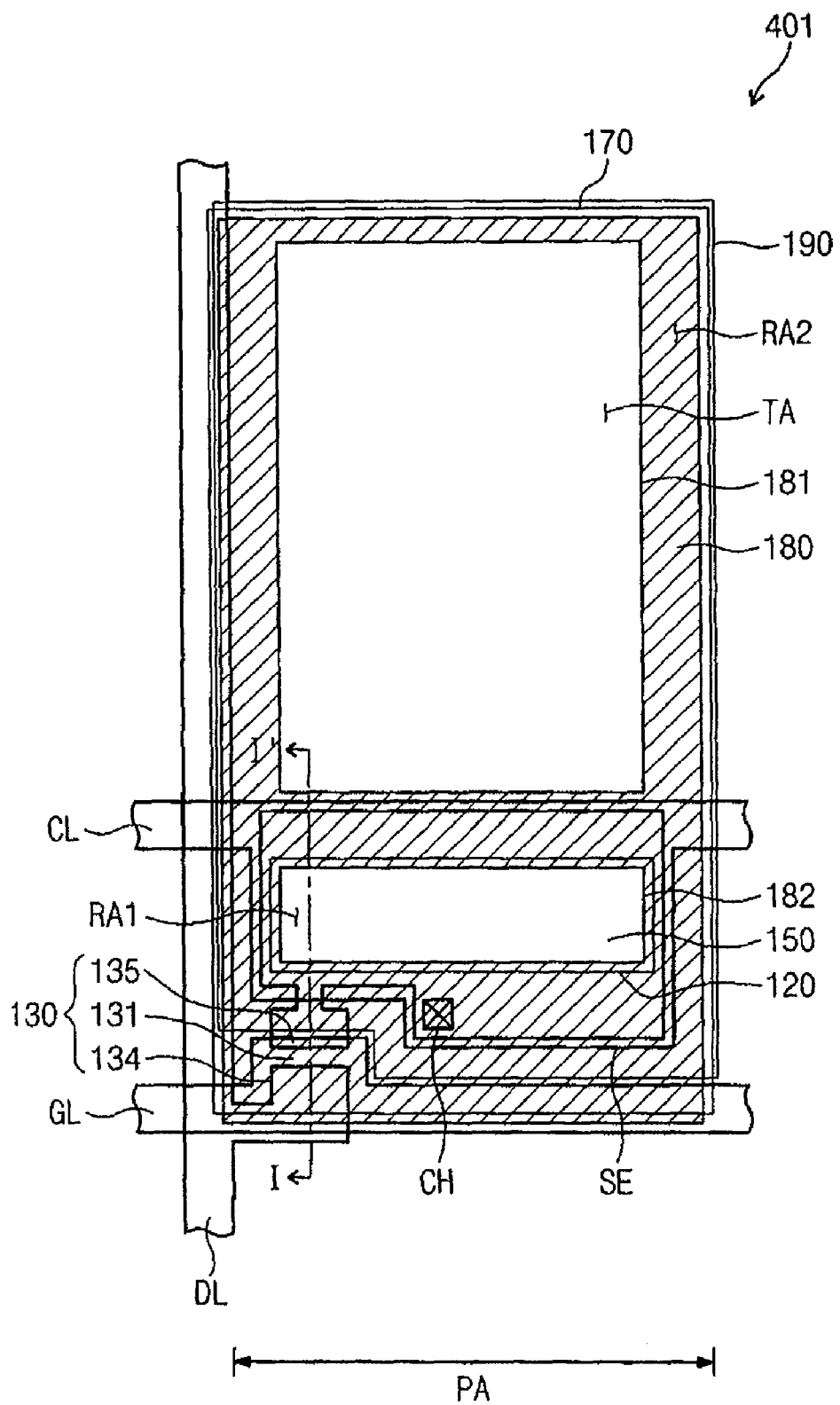
FIG. 1 is a plan view showing an exemplary embodiment of a liquid crystal.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 2:
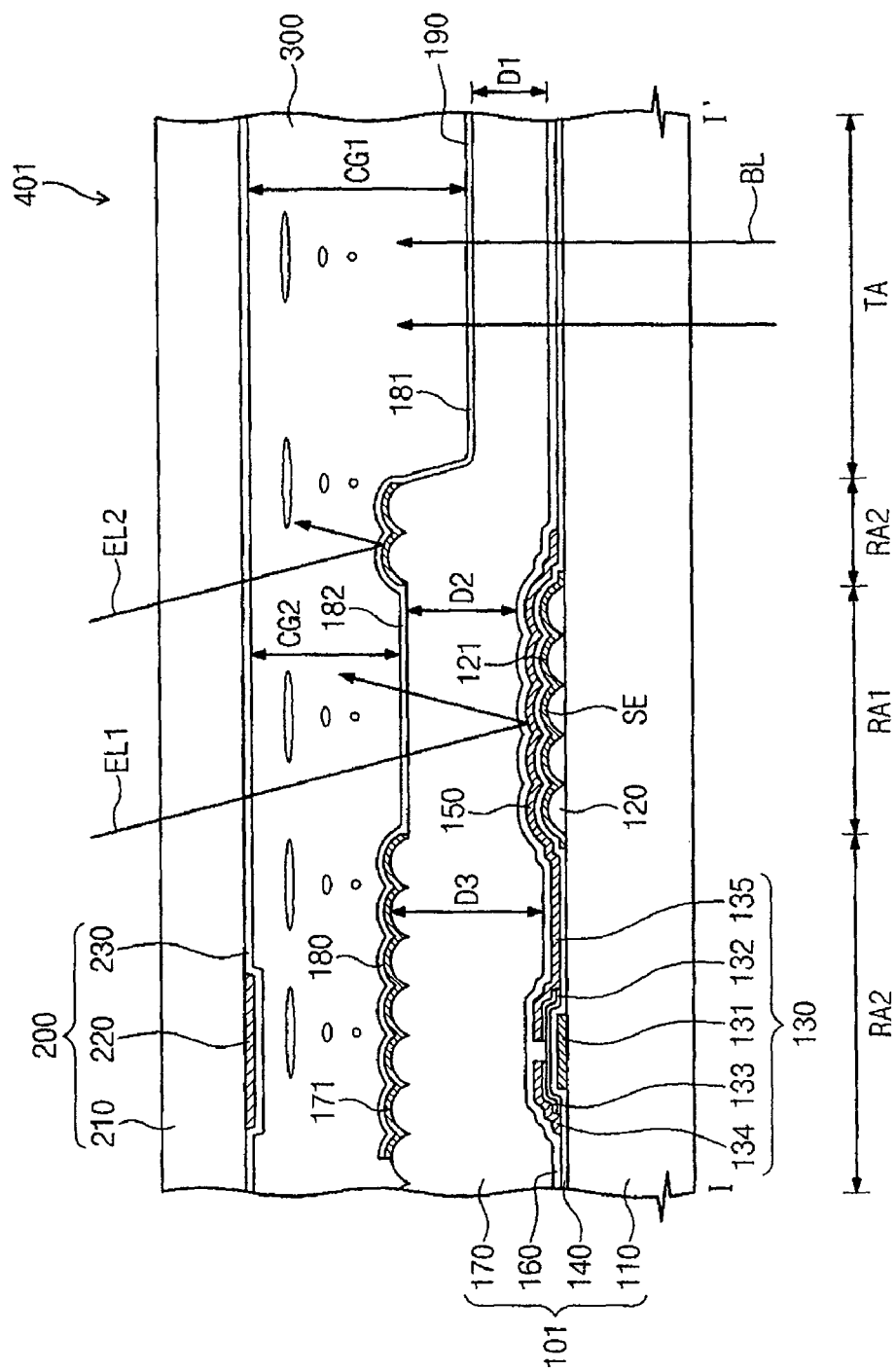
FIG. 2 is a cross-sectional view taken along a line I-I' of FIG. 1.

FIG. 1 is a plan view showing an exemplary embodiment of a liquid crystal display, and FIG. 2 is a cross-sectional view taken along a line I-I' of FIG. 1.

Referring to FIGS. 1 and 2, a liquid crystal display 401 may include an array substrate 101, an opposite substrate 200, and a liquid crystal layer 300.

The array substrate 101 may include a first base substrate 110, a gate line GL, a data line DL, a patterned layer 120, a thin film transistor 130, a first reflection layer 150, a color filter 170, a second reflection layer 180, and a pixel electrode 190.

A pixel area PA that displays an image may be defined in the first base substrate 110. The pixel area PA may include a transmission area TA, a first reflection area RA1, and a second reflection area RA2. The transmission area TA transmits a light BL provided from a backlight assembly (not shown), and the first and second reflection areas RA1 and RA2 reflect external lights EL1 and EL2.

The gate line GL may be formed on the first base substrate 110 and transmits a gate signal. The data line DL may be formed on the first base substrate 110 and transmits a data signal. The data line DL may be insulated from and intersected with the gate line GL. The data line DL and the gate line GL define the pixel area PA.

The patterned layer 120 and the thin film transistor 130 may be formed in the pixel area PA. The patterned layer 120 may be formed on the first base substrate 110 corresponding to the first reflection area RA1 and may include a first reflection pattern 121 formed thereon. The first reflection pattern 121 includes a plurality of convex portions which may improve the reflectance of the external light EL1 that is incident on the first reflection area RA1.

The thin film transistor 130 may include a gate electrode 131 branched from the gate line GL, an active layer 132 and an ohmic contact layer 133 sequentially formed above the gate electrode 131, a source electrode 134 branched from the data line DL and formed on the ohmic contact layer 133, and a drain electrode 135 formed on a same layer as the source electrode 134. In an exemplary embodiment, the drain electrode 135 may be formed over both the first reflection area RA1 and the second reflection area RA2.

A gate insulating layer 140 may be formed on the first base substrate 110 on which the gate electrode 131 and the patterned layer 120 are formed. The gate insulating layer 140 may cover the gate line GL and the gate electrode 131.

The first reflection layer 150 may be formed on the gate insulating layer 140 corresponding to the first reflection area RA1. The first reflection layer 150 may include a non-transparent metal material to reflect the external light EL1 that is incident on the first reflection area RA1. The first reflection layer 150 is integrally formed with the drain electrode 135 on a same layer. That is, the drain electrode 135 may serve the same function as that of the first reflection layer 150. Also, since the first reflection layer 150 is formed corresponding to the first reflection pattern 121, the first reflection layer 150 has substantially the same shape as that of the first reflection pattern 121. Thus, the reflectance of the first reflection layer 150 may be improved.

A protective layer 160 may be formed on the gate insulating layer 140 on which the first reflection layer 150 is formed. The protective layer 160 may include an inorganic insulating material such as nitride silicon SiNx. The protective layer 160 may cover the data line DL, the source electrode 134, and the drain electrode 135.

The color filter 170 may be formed on the protective layer 160 corresponding to the pixel area PA. The color filter 170 displays colors using a light.

The second reflection layer 180 may be arranged on the color filter 170. The second reflection layer 180 may be formed on the color filter 170 corresponding to the second reflection area RA2 and may include a non-transparent metal material to reflect the external light EL2 that is incident on the second reflection area RA2.

In an exemplary embodiment, the color filter 170 may include a second reflection pattern 171 formed thereon to improve the reflectance of the second reflection layer 180. The second reflection pattern 171 may include a plurality of convex portions and be formed on the color filter 170 corresponding to the second reflection area RA2. Also, since the second reflection layer 180 is formed corresponding to the second reflection pattern 171, the second reflection layer 180 has substantially the same shape as that of the second reflection pattern 171. Thus, the reflectance of the second reflection layer 180 may be improved.

Also, a first opening 181 may be formed through the second reflection layer 180 corresponding to the transmission area TA, and a second opening 182 may be formed through the second reflection layer 180 corresponding to the first reflection area RA1. Accordingly, the external light EL1 incident on the first reflection area RA1 is provided to the first reflection layer 150 through the second opening 182.

The pixel electrode 190 may be formed on the color filter 170 on which the second reflection layer 180 is formed. The pixel electrode 190 may include a transparent conductive material such as indium tin oxide (ITO) or indium zinc oxide (IZO) and may cover the second reflection layer 180 and the color filter 170. The color filter 170 may be partially removed, so that a contact hole CH may be formed therethrough to expose the drain electrode 135. The pixel electrode 190 may be electrically connected to the drain electrode 135 through the contact hole CH.

The array substrate 101 may further include a storage line CL that transmits a storage voltage and a storage electrode SE. The storage line CL may be formed on a same layer as the gate line GL and extended in a same direction as the gate line GL. The storage electrode SE may be branched from the storage line CL and formed under the gate insulating layer 140 to cover an upper portion of the patterned layer 120.

The storage electrode SE and the gate insulating layer 140 each have a thickness of about hundreds of nanometers (nm). Accordingly, the storage electrode SE and the gate insulating layer 140 are formed corresponding to the first reflection pattern 121 of the patterned layer 120 in the first reflection area RA1 and have the same shape as that of the first reflection pattern 121.

The opposite substrate 200 is arranged above the array substrate 101. The opposite substrate 200 may include a second base substrate 210 facing the first base substrate 110, a black matrix 220 formed on the second base substrate 210, and a common electrode 230 receiving a common voltage. The black matrix 220 faces the thin film transistor 130 and blocks a light. The common electrode 230 is formed on the second base substrate 210 and may cover the second base substrate 210 and the black matrix 220. The common electrode 230 may include a transparent conductive material such as ITO or IZO.

The liquid crystal layer 300 may be interposed between the array substrate 101 and the opposite substrate 200 and may control the transmittance of the lights BL, EL1, and EL2 according to an electric field generated by the pixel electrode 190 and the common electrode 230. In an exemplary embodiment, a thickness D1 of the color filter 170 in the transmission area TA is thinner than a thickness D2 of the color filter 170 in the first reflection area RA1 and thinner than a thickness D3 of the color filter 170 in the second reflection area RA2.

As described above, the liquid crystal display 401 may display the image in a reflection mode since the liquid crystal display 401 includes the first and second reflection layers 150 and 180. For example, the external light EL1 incident on the first reflection area RA1 may be reflected by the first reflection layer 150 and may be incident on the liquid crystal layer 300 through the second opening 180 after passing through the color filter 170. The external light EL2 incident to the second reflection area RA2 is reflected by the second reflection layer 180 and provided to the liquid crystal layer 300.

The external light EL1 that is reflected by the first reflection layer 150 is provided to the liquid crystal layer 300 after passing through the color filter 170. However, the external light EL2 that is reflected by the second reflection layer 180 is provided to the liquid crystal layer 300 without passing through the color filter 170. That is, in the reflection mode, the external light EL1 reflected by the first substrate 150 may display the colors, and the external light EL2 reflected by the second reflection layer 180 may control the reflectance of the liquid crystal display 401.

In the present exemplary embodiment, a color reproduction rate of the liquid crystal display 401 may be adjusted according to a size of the first reflection layer 150 exposed through the second opening 182 of the second reflection layer 180. Thus, the color reproduction rate of the liquid crystal display 401 is a consideration in determining the size of the second opening 182. Also, since the reflectance of the liquid crystal display 401 is controlled by a size of the second reflection layer 180, the reflectance of the liquid crystal display 401 is a consideration in determining the size of the second reflection layer 180.

As described above, the liquid crystal display 401 may include the first reflection layer 150 and the second reflection layer 180 arranged on different layers, so that the liquid crystal display 401 may display the image using the transflective mode in a color filter-on-array (COA) structure. Therefore, the light loss of the liquid crystal display 401 may be reduced, thereby improving a display characteristic of the liquid crystal display 401.

Hereinafter, a method of fabricating the array substrate 101 will be described in detail with reference to following FIGS. 3A to 3K.

FIGS. 3A to 3K are cross-sectional views illustrating an exemplary embodiment of a fabricating process of the array substrate of FIG. 2.

Figure 3A:
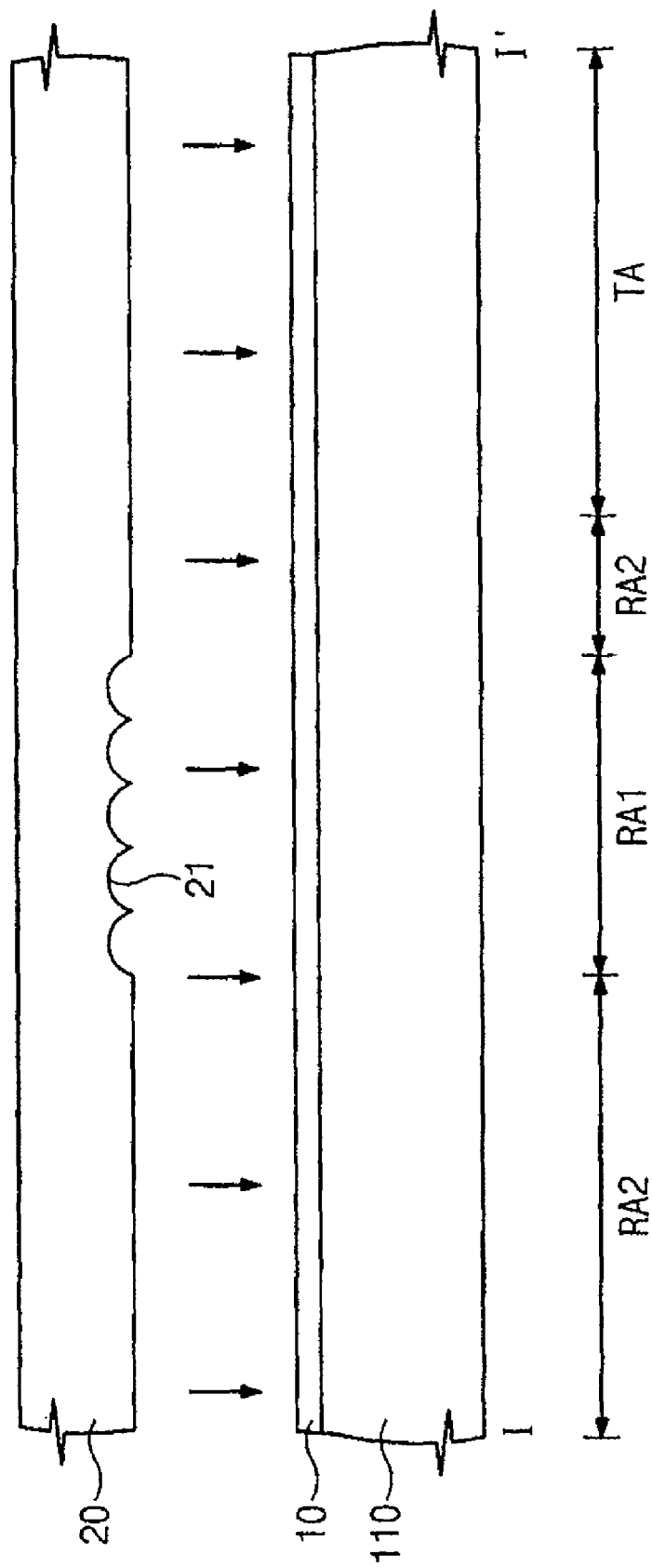
Figure 3B:
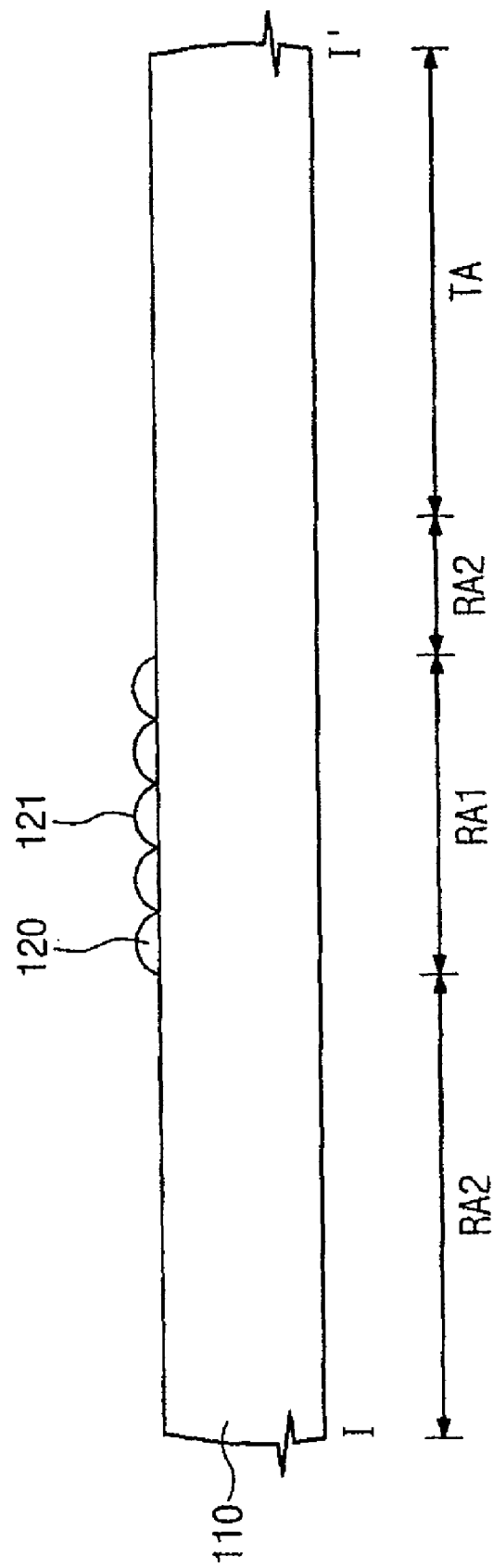

Referring to FIGS. 3A and 3B, a first resin layer 10 including an organic material is deposited on the first base substrate 110.

Then, a first mold substrate 20 is arranged on the first resin layer 10. The first mold substrate 20 is spaced apart from the first resin layer 10 and faces the first resin layer 10. A first etch pattern 21 having a concave-convex shape is formed on the lower portion of the first mold substrate 20.

The first mold substrate 20 arranged on the first resin layer 10 is pressed to the first resin layer 10, and the first resin layer 10 is cured to pattern the first resin layer 10.

The first resin layer 10 is patterned according to the first etch pattern 21 to form a patterned layer 120 corresponding to the first reflection pattern 121 in the first reflection area RA1.

As described above, the patterned layer 120 may be formed through an imprint process using the first mold substrate 20. Since the imprint process is able to control a fine pattern accurately, an accuracy of the first reflection pattern 121 may be improved. Also, control of the first reflection pattern 121 may become easier and the reflectance of the first reflection layer 150 (shown in FIG. 2) may be improved.

In an exemplary embodiment, the patterned layer 120 is formed through the imprint process using the first mold substrate 20. In another exemplary embodiment, however, the patterned layer 120 may be formed through a photolithography process using a mask.

Referring to FIGS. 3C and 3D, a first metal layer 30 may be deposited on the first base substrate 110 on which the patterned layer 120 is formed. Since the first metal layer 30 is may have a thickness of hundreds of nanometers (nm), the first metal layer 30 may have a shape that is the same as the first reflection pattern 121 in the first reflection area RA1.

Then, the first metal layer 30 may be patterned to form the gate electrode 131. Although not shown in FIGS. 3C and 3D, the gate line GL (shown in FIG. 1), the storage line CL (shown in FIG. 1) and the gate electrode 131 may also be formed during the patterning process of the first metal layer 30.

The storage electrode SE may be also be formed during the patterning process of the first metal layer 30.

Referring to FIGS. 3E and 3F, the gate insulating layer 140 may be deposited on the first base substrate 110 on which the gate electrode 131 is formed. Then, the active layer 132 and the ohmic contact layer 133 may be sequentially formed on the gate insulating layer 140, and a second metal layer 40 may be formed on the gate insulating layer 140 on which the active layer 132 and the ohmic contact layer 133 are formed.

The second metal layer 40 is patterned to form the source electrode 134 and the drain electrode 135. The first reflection layer 150 is integrally formed with the drain electrode 135. Although not shown in FIGS. 3E and 3F, the data line DL (shown in FIG. 1) and the source electrode 134 may be formed during the patterning process of the second metal layer 40.

Then, the protective layer 160 may be formed on the gate insulating layer 140.

Figure 3G:
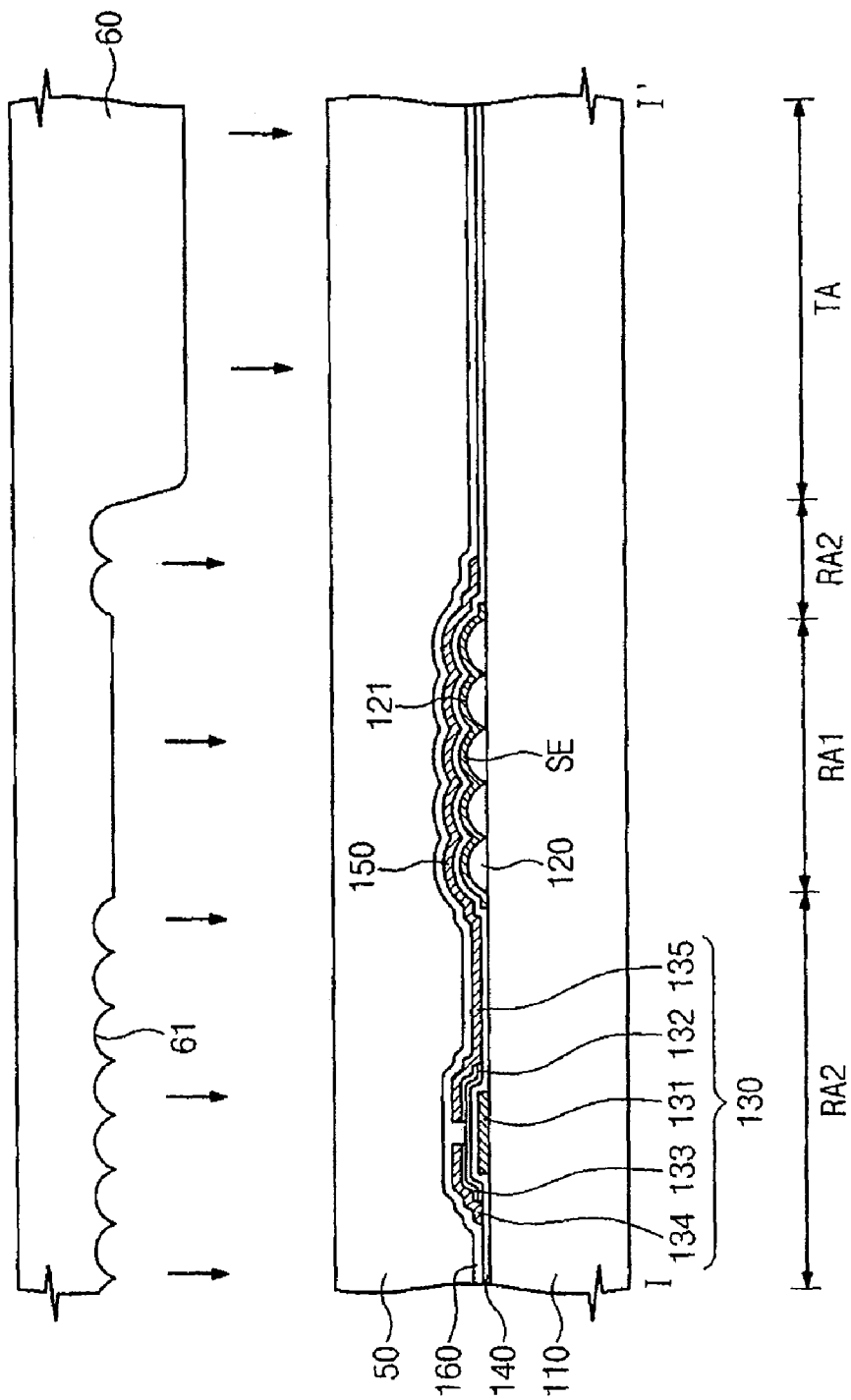

Referring to FIGS. 3G and 3H, a second resin layer 50 may be deposited on the protective layer 160. The second resin layer 50 may include an organic material and may display a predetermined color using light.

Then, a second mold substrate 60 is arranged on the second resin layer 50. The second mold substrate 60 is spaced apart from the second resin layer 50 and faces the second resin layer 50. A second etch pattern 61 having a concave-convex shape is formed on a lower portion of the second mold substrate 60.

After the second mold substrate 60 is arranged on the second resin layer 50 and pressed to the second resin layer 50, the second resin layer 50 is cured to pattern the second resin layer 50.

The second resin layer 50 is patterned corresponding to the second etch pattern 61 to form the color filter 170 having the second reflection pattern 171 on the first base substrate 110.

As described above, the color filter 170 may be formed through an imprint process using the second mold substrate 60. Since the imprint process is able to control a fine pattern accurately, an accuracy of the second reflection pattern 171 may be improved. Also, control of the second reflection pattern 171 may become easier, and the reflectance of the second reflection layer 180 (shown in FIG. 2) may be improved.

In an exemplary embodiment, the color filter 170 is formed through the imprint process using the second mold substrate 60. In another exemplary embodiment, the patterned layer 120 may be formed through a photo-etching process using a mask.

Referring to FIGS. 3I and 3J, a third metal layer 70 may be deposited on the color filter 170, and the third metal layer 70 may be patterned to form the second reflection layer 180. Since the third metal layer 70 may have a thickness of hundreds of nanometers (nm), the third metal layer 70 may have a shape that is the same as the shape of the second reflection pattern 171 in the second reflection area RA2.

During the patterning process of the third metal layer 70, the third metal layer 70 may be removed in the transmission area TA to form the first opening 181 therethrough, and the third metal layer 70 may be removed in the first reflection area RA1 to form the second opening 182 therethrough.

Referring to FIG. 3K, a transparent fourth metal layer 80 may be deposited on the color filter 170 on which the second reflection layer 180 is formed. The fourth metal layer 80 may be patterned to form the pixel electrode 190 (shown in FIG. 2). Thus, the array substrate 101 (shown in FIG. 2) may be completely fabricated.

Figure 4:
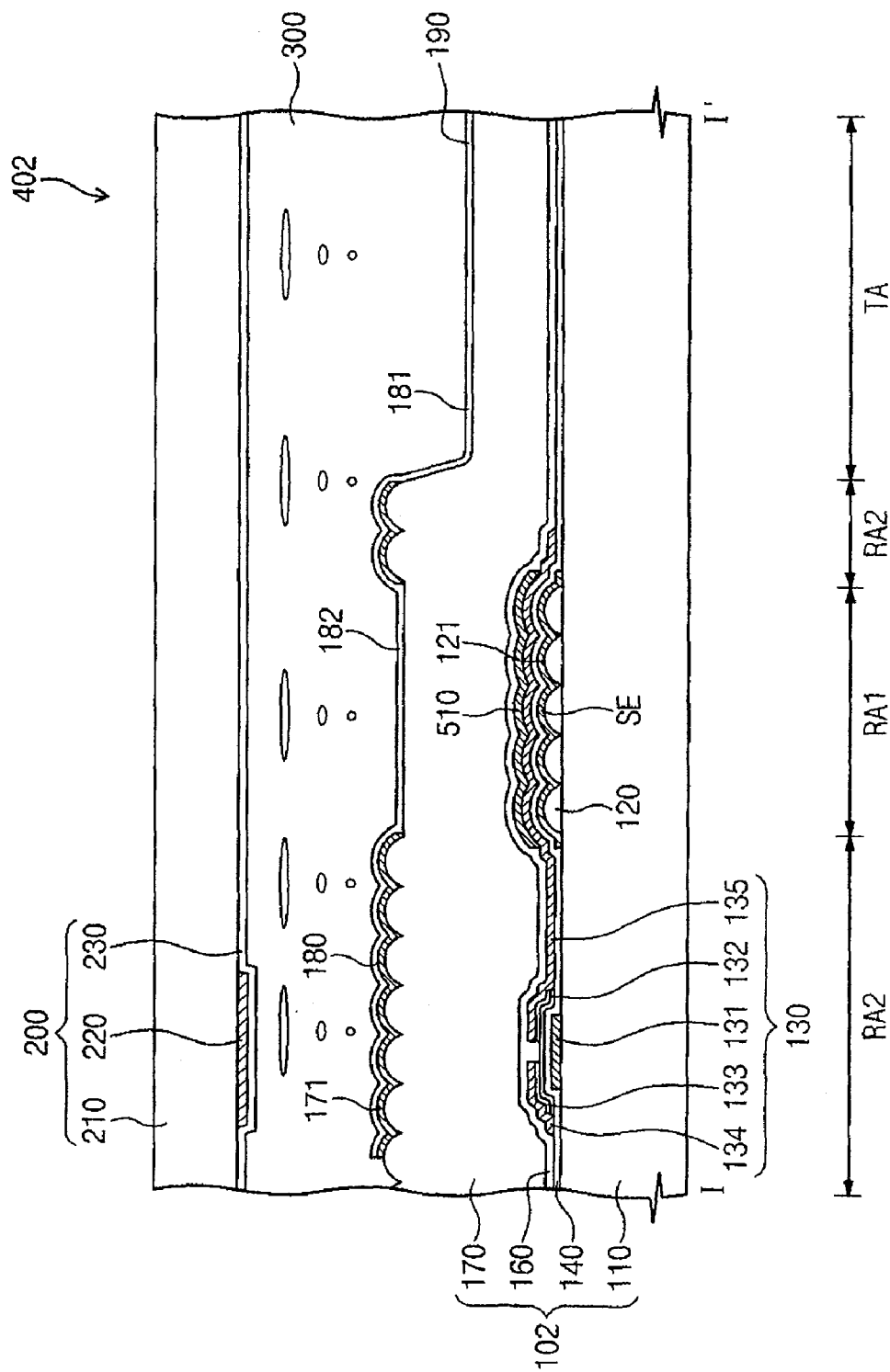
FIG. 4 is a cross-sectional view showing an exemplary embodiment of a liquid crystal display.

FIG. 4 is a cross-sectional view showing another exemplary embodiment of a liquid crystal display.

Referring to FIG. 4, a liquid crystal display 402 includes an array substrate 102, an opposite substrate 200, and a liquid crystal layer 300.

In the present exemplary embodiment, the array substrate 102 may have the same configurations and same functions as those of the array substrate 101 shown in FIG. 2, except for the first reflection layer 510. Thus, in FIG. 4, the same reference numerals denote the same elements in FIG. 2, and the detailed descriptions of the same elements will be omitted. Also, in FIG. 4, the opposite substrate 200 and the liquid crystal layer 300 have same configurations and functions as those of the opposite substrate 200 and the liquid crystal layer 300 shown in FIG. 2. Thus, the same reference numerals denote the same elements in FIG. 2, and the detailed descriptions of the same elements will be omitted.

A patterned layer 120 may be formed on a first base substrate 110 of the array substrate 102 corresponding to a first reflection area RA1.

A drain electrode 135 may be formed in the first reflection area RA1 corresponding to a first reflection pattern 121 of the patterned layer 120 and may have the same shape as the first reflection pattern 121.

The first reflection layer 510 may be formed on the drain electrode 135 corresponding to the first reflection area RA1. The first reflection layer 510 includes a non-transparent metal material to reflect an external light EL1 incident on the first reflection area RA1. Also, the first reflection layer 510 is formed corresponding to the first reflection pattern 121 of the patterned layer 120 and may have the same shape as the shape of the first reflection pattern 121. Thus, the reflectance of the first reflection layer 510 may be improved.

The opposite substrate 200 is arranged on the array substrate 102 with the liquid crystal layer 300 interposed between the array substrate 102 and the opposite substrate 200.

Figure 5:
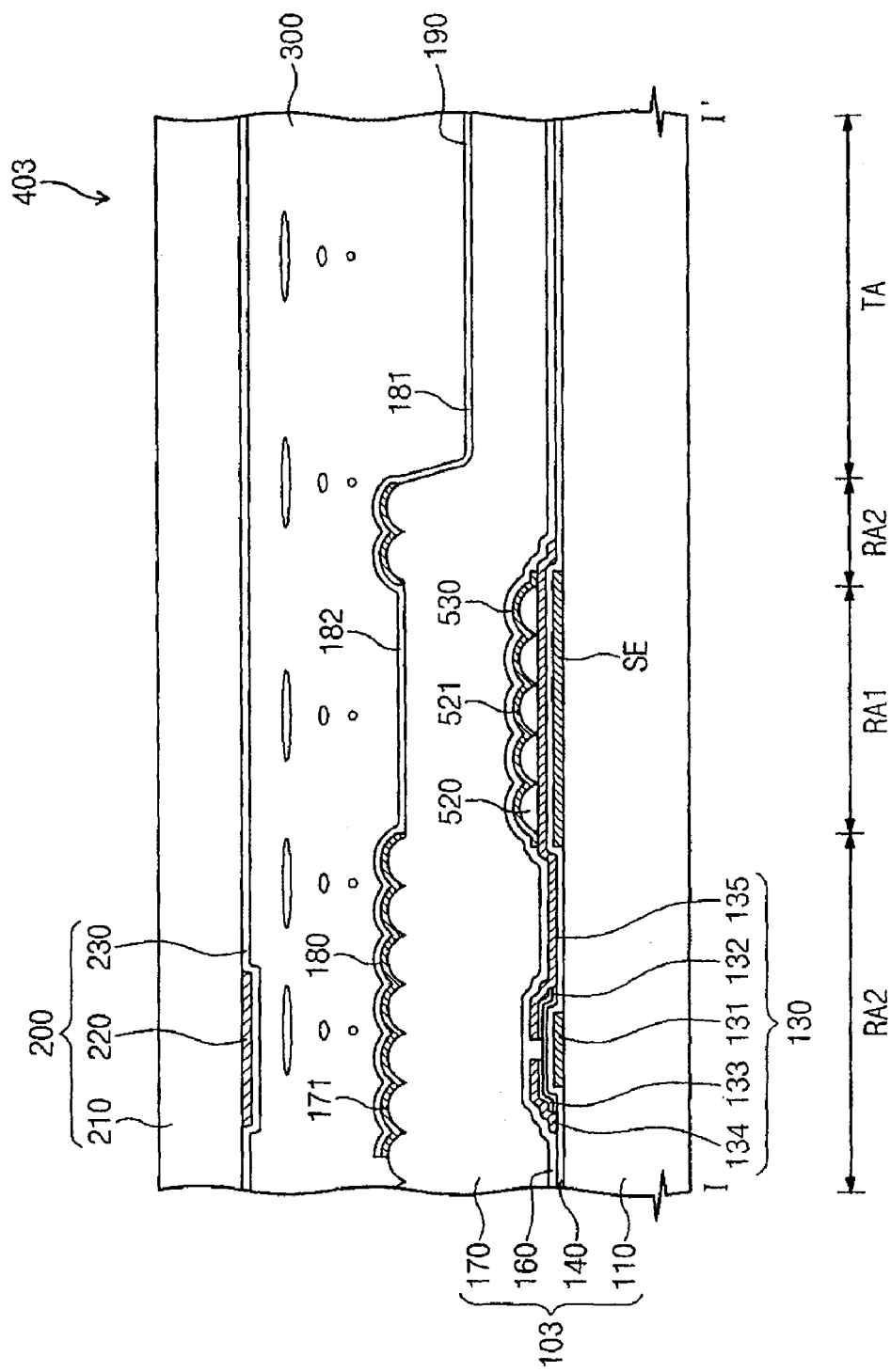
FIG. 5 is a cross-sectional view showing an exemplary embodiment of a liquid crystal display.

FIG. 5 is a cross-sectional view showing another exemplary embodiment of a liquid crystal display.

Referring to FIG. 5, a liquid crystal display 403 may include an array substrate 103, an opposite substrate 200, and a liquid crystal layer 300.

The array substrate 103 may have the same configurations and same functions as those of the array substrate 101 of FIG. 2, except for a patterned layer 520 and a first reflection layer 530. Thus, in FIG. 5, the same reference numerals denote the same elements in FIG. 2, and the detailed descriptions of the same elements will be omitted. The opposite substrate 200 and the liquid crystal layer 300 in FIG. 5 may also have the same configurations and same functions as those of the opposite substrate 200 and the liquid crystal layer 300 of FIG. 2. Thus, in FIG. 5, the same reference numerals denote the same elements in FIG. 2, and the detailed descriptions of the same elements will be omitted.

A patterned layer 520 may be formed on a first base substrate 110 of the array substrate 103 corresponding to a first reflection area RA1. The patterned layer 520 may be formed on a drain electrode 135 of a thin film transistor 130. The patterned layer 520 includes an organic material and a first reflection pattern 521 is formed thereon. The first reflection pattern 521 may include a plurality of convex portions to improve the reflectance of the external light EL1 incident on the first reflection area RA1. The patterned layer 520 may be formed through the imprint process shown in FIG. 3 or may be formed through a photolighography process.

The first reflection layer 530 may be formed on the patterned layer 520. The first reflection layer 530 is formed corresponding to the first reflection area RA1 and includes a non-transparent metal material to reflect the external light EL1 incident to the first reflection area RA1. Also, the first reflection layer 530 is formed corresponding to the first reflection pattern 521 and may have the same shape as the shape of the first reflection pattern 521. Therefore, the reflectance of the first reflection layer 530 may be improved.

A protective layer 160 may be formed on the first base substrate 110 on which the first reflection layer 530 is formed.

The protective layer 160 covers a source electrode 134 and a drain electrode 135 of a thin film transistor 130 and the first reflection layer 530.

In addition, the array substrate 103 may further include a storage electrode SE that is formed on the first base substrate 110. The storage electrode SE may be positioned under the drain electrode 135 of the thin film transistor 130 and the upper portion of the storage electrode SE may be covered by a gate insulating layer 140.

The opposite substrate 200 may be arranged on the array substrate 103 with the liquid crystal layer 300 interposed between the array substrate 103 and the opposite substrate 200.

According to the above, the thin film transistor display substrate includes the first and second reflection layers arranged on the upper portion and the lower portion, respectively. Thus, the thin film transistor display substrate having the color filter-on-array structure may display the image in the transflective mode, thereby reducing the light loss and improving the display characteristic.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A thin film transistor display substrate comprising:
a base substrate on which a pixel area including a first reflection area and a second reflection area is defined;
a gate line formed on the base substrate;
a data line formed on the base substrate, the data line being insulated from and intersected with the gate line to define the pixel area;
a thin film transistor formed in the pixel area and connected to the gate line and the data line;
a first reflection layer formed on the base substrate and corresponding to the first reflection area;
a color filter formed on the first reflection layer and corresponding to the pixel area;
a second reflection layer formed on the color filter and corresponding to the second reflection area; and
a pixel electrode formed on the color filter and electrically connected to the thin film transistor.

2. The thin film transistor display substrate of claim 1, further comprising a patterned layer formed under the first reflection layer, the patterned layer including a first reflection pattern formed thereon.

3. The thin film transistor display substrate of claim 2, wherein the first reflection layer is formed on a same layer as a drain electrode of the thin film transistor.

4. The thin film transistor display substrate of claim 3, wherein the first reflection layer is electrically connected to the drain electrode.

5. The thin film transistor display substrate of claim 3, wherein the first reflection layer is integrally formed with the drain electrode.

6. The thin film transistor display substrate of claim 2, wherein the first reflection layer is formed on the drain electrode.

7. The thin film transistor display substrate of claim 6, wherein the patterned layer is formed under the drain electrode.

8. The thin film transistor display substrate of claim 6, wherein the patterned layer is formed on the drain electrode.

9. The thin film transistor display substrate of claim 2, further comprising a storage electrode that is formed in the first and second reflection areas, positioned under the drain electrode of the thin film transistor to receive a storage voltage.

10. The thin film transistor display substrate of claim 9, wherein the patterned layer is formed under the storage electrode.

11. The thin film transistor display substrate of claim 2, wherein a second reflection pattern is formed on the color filter corresponding to the first and second reflection areas.

12. A method of fabricating a thin film transistor display substrate, comprising:
forming a thin film transistor in a pixel area of a base substrate;
forming a first reflection layer in a first reflection area of the pixel area;
forming a color filter on the base substrate, on which the thin film transistor and the first reflection layer are formed, corresponding to the pixel area;
forming a second reflection layer on the color filter corresponding to a second reflection area of the pixel area; and
forming a pixel electrode that is electrically connected to the thin film transistor on the color filter.

13. The method of claim 12, prior to forming the first reflection layer, further comprising forming a patterned layer including a first reflection pattern formed thereon in the first reflection area.

14. The method of claim 13 wherein the forming of the patterned layer comprises:
forming a first resin layer on the base substrate;
arranging a first mold substrate on which a first etch pattern is formed on the first resin layer; and
pressing the first mold substrate to the first resin layer and patterning the first resin layer according to the first etch pattern to form the patterned layer.

15. The method of claim 13, wherein the first reflection layer is formed together with the drain electrode through a forming process of the drain electrode of the thin film transistor.

16. The method of claim 13, wherein the first reflection layer is formed on the drain electrode of the thin film transistor.

17. The method of claim 16, wherein the patterned layer is formed under the drain electrode.

18. The method of claim 16, wherein the patterned layer is formed on the drain electrode.

19. The method of claim 18, further comprising forming a storage electrode in the first and second reflection areas during a forming process of a gate electrode of the thin film transistor.

20. The method of claim 19, wherein a second reflection pattern is formed on the color filter corresponding to the first and second reflection areas.

21. The method of claim 20, wherein the color filter is formed by:
forming a second resin layer on the base substrate;
arranging a second mold substrate on which a second etch pattern is formed on the second resin layer; and
pressing the second mold substrate to the second resin layer and patterning the second resin layer according to the second etch pattern to form the color filter.

* * * * *